(12) United States Patent
Hanks

(10) Patent No.: US 9,255,718 B1
(45) Date of Patent: Feb. 9, 2016

(54) ADD A VENT WINDOW SYSTEM

(76) Inventor: Thomas Frank Hanks, Tampa, FL (US)

( * ) Notice: Subject to any disclaimer, the term of this patent is extended or adjusted under 35 U.S.C. 154(b) by 626 days.

(21) Appl. No.: 13/611,377

(22) Filed: Sep. 12, 2012

(51) Int. Cl.
*F24F 7/00* (2006.01)
*H01L 21/677* (2006.01)

(52) U.S. Cl.
CPC ............ *F24F 7/00* (2013.01); *H01L 21/67769* (2013.01)

(58) Field of Classification Search
CPC ............ B60J 1/085; F16B 7/10; F41B 15/027
See application file for complete search history.

(56) References Cited

U.S. PATENT DOCUMENTS

| | | | | |
|---|---|---|---|---|
| 1,922,159 | A * | 8/1933 | Goldberg | 296/96.11 |
| 2,582,420 | A * | 1/1952 | Ellis | 16/340 |
| 2,797,126 | A * | 6/1957 | Brooks | 454/134 |
| 3,327,310 | A * | 6/1967 | Bethune et al. | 343/702 |
| 4,037,839 | A * | 7/1977 | Nelson | 463/47.7 |
| 4,111,106 | A * | 9/1978 | Burns | 454/132 |
| 4,341,150 | A * | 7/1982 | McConnell et al. | 454/135 |
| 4,423,668 | A * | 1/1984 | Long | 454/128 |
| 4,850,142 | A * | 7/1989 | Sasamura et al. | 49/381 |

* cited by examiner

*Primary Examiner* — Steven B McAllister
*Assistant Examiner* — Reginald McNeill, II

(57) ABSTRACT

A small window has upper, lower, forward and rearward edges. A support assembly includes tubular upper and lower cylindrical sections. The upper cylindrical section is removably positioned within an upper slot. The lower cylindrical section is removably positioned within a lower slot.

1 Claim, 2 Drawing Sheets

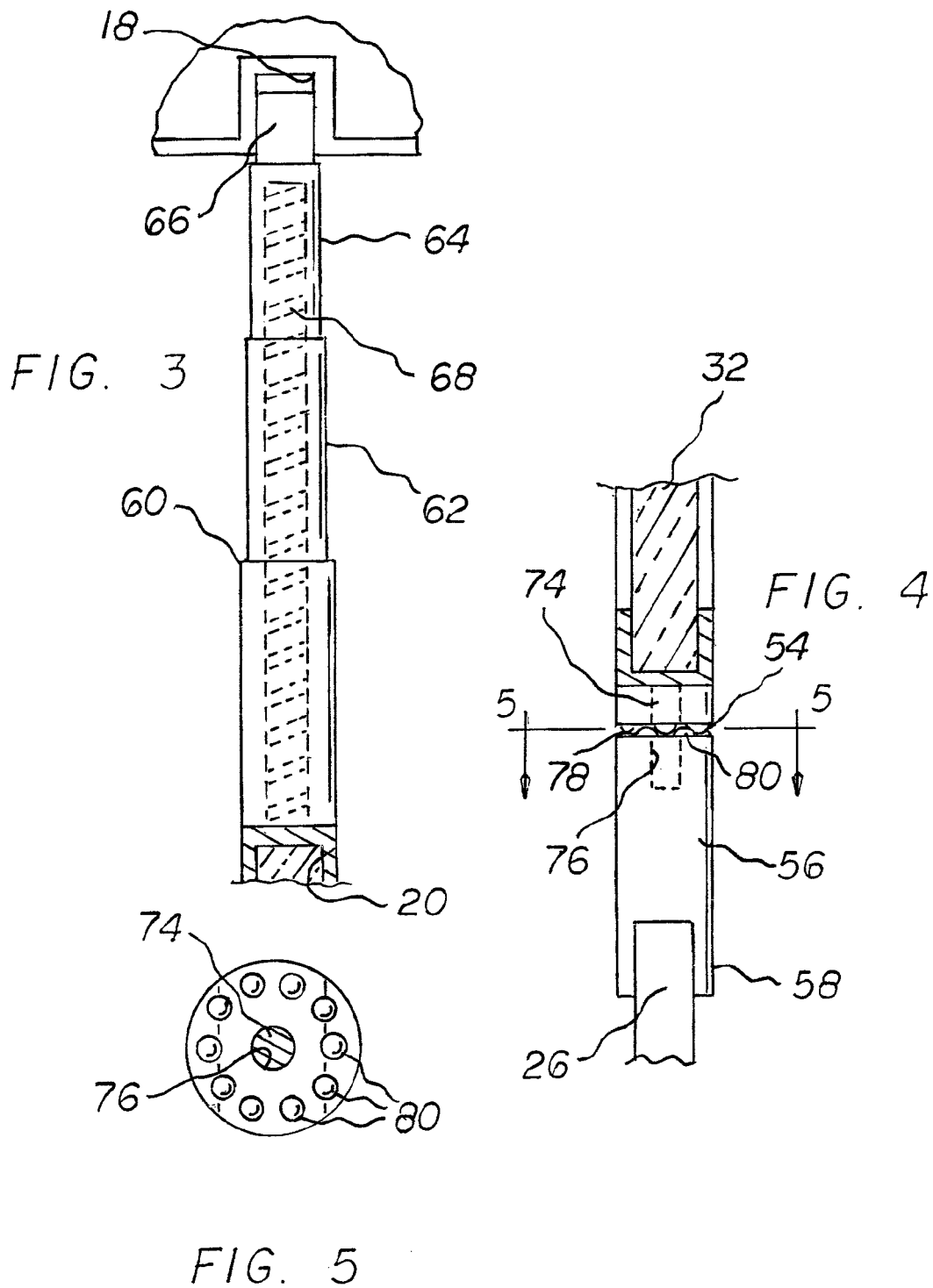

ADD A VENT WINDOW SYSTEM

BACKGROUND OF THE INVENTION

Field of the Invention

The present invention relates to an add a vent window system and more particularly pertains to positioning in a window of a vehicle and for redirecting an air flow there adjacent thereby ventilating the vehicle for the comfort of passengers, the positioning and redirecting and ventilating being done in a safe, convenient and economical manner.

SUMMARY OF THE INVENTION

In view of the disadvantages inherent in the known types of window systems of known designs and configurations now present in the prior art, the present invention provides an improved add a vent window system. As such, the general purpose of the present invention, which will be described subsequently in greater detail, is to provide a new and improved add a vent window system and method which has all the advantages of the prior art and none of the disadvantages.

To attain this, the present invention essentially comprises an add a vent window system. A small window has upper, lower, forward and rearward edges. A support assembly includes tubular upper and lower cylindrical sections. The upper cylindrical section is removably positioned within an upper slot. The lower cylindrical section is removably positioned within a lower slot.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved add a vent window system which has all of the advantages of the prior art window systems of known designs and configurations and none of the disadvantages.

It is another object of the present invention to provide a new and improved add a vent window system which may be easily and efficiently manufactured and marketed.

It is further object of the present invention to provide a new and improved add a vent window system which is of durable and reliable constructions.

An even further object of the present invention is to provide a new and improved add a vent window system which is susceptible of a low cost of manufacture with regard to both materials and labor, and which accordingly is then susceptible of low prices of sale to the consuming public, thereby making such add a vent window system economically available to the buying public.

Lastly, it is an object of the present invention to provide an add a vent window system for positioning in a window of a vehicle and for redirecting an air flow there adjacent thereby ventilating the vehicle for the comfort of passengers, the positioning and redirecting and ventilating being done in a safe, convenient and economical manner.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 3 is a cross sectional view taken along line 3-3 of FIG. 1.

FIG. 4 is a cross sectional view taken along line 4-4 of FIG. 1.

FIG. 5 is a cross sectional view taken along line 5-5 of FIG. 4.

The same reference numerals refer to the same parts throughout the various Figures.

DESCRIPTION OF THE PREFERRED EMBODIMENT

Figure 1:
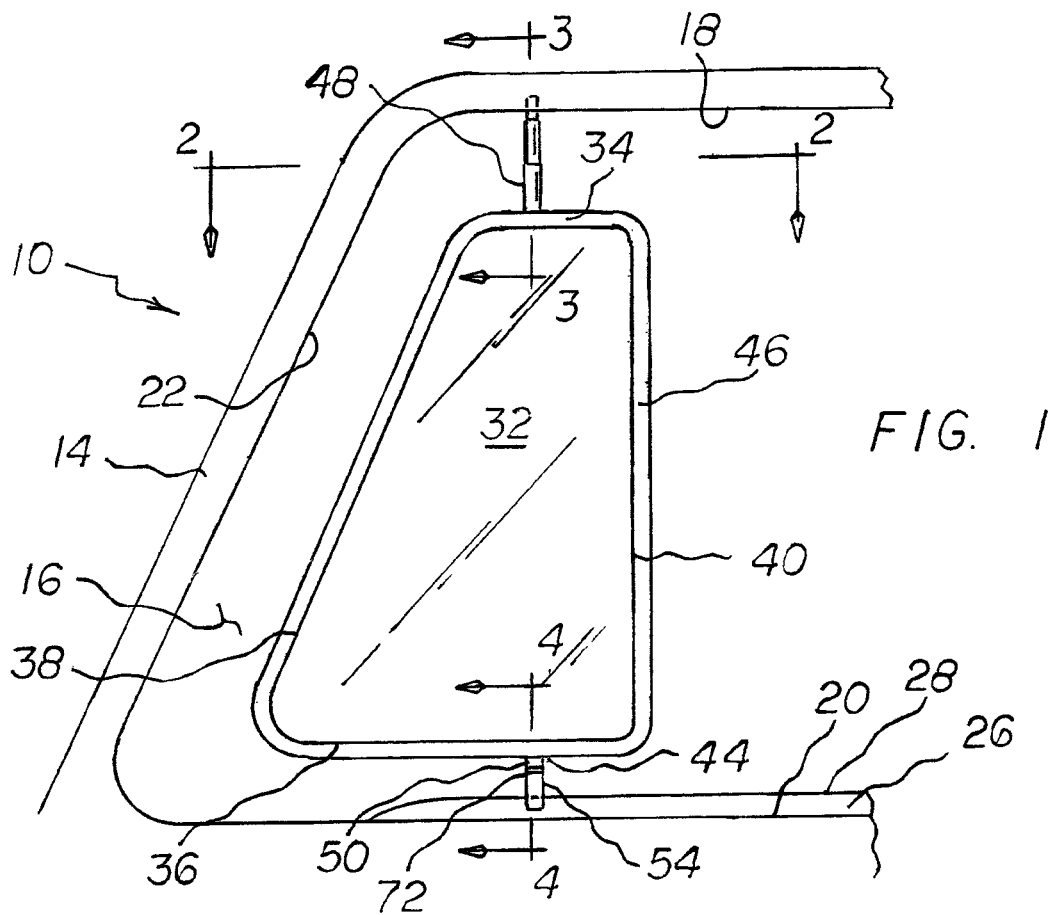
FIG. 1 is a side elevational view of an add a vent system constructed in accordance with the principles of the present invention.
Figure 2:
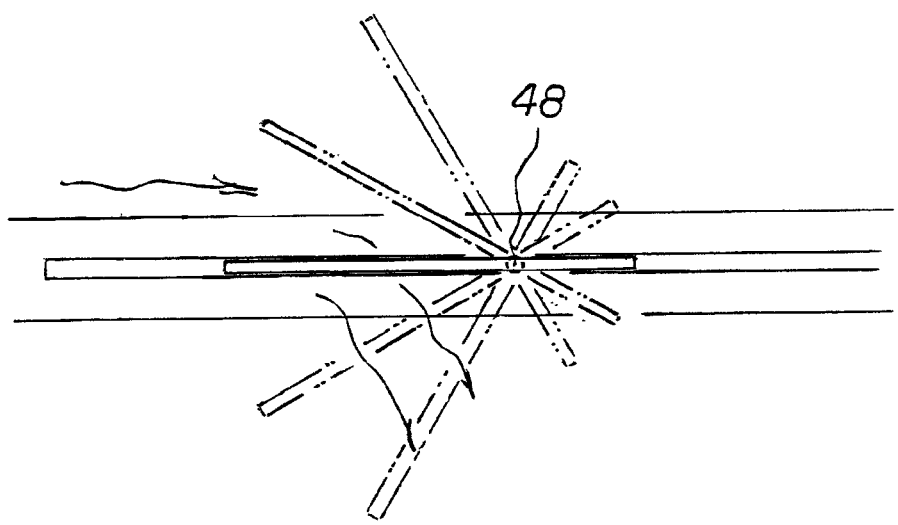
FIG. 2 is a plan view of the system taken along line 2-2 of FIG. 1.

With reference now to the drawings, and in particular to FIG. 1 thereof, the preferred embodiment of the new and improved add a vent window system embodying the principles and concepts of the present invention and generally designated by the reference numeral 10 will be described.

The present invention, the add a vent window system 10 is comprised of a plurality of components. Such components in their broadest context include a small window and a support assembly. Such components are individually configured and correlated with respect to each other so as to attain the desired objective.

First provided is a vehicle 14. The vehicle has a window opening 16. The window opening includes an upper slot 18. The window opening also includes a lower slot 20. The window opening further includes a forward slot 22.

A large window 26 is provided. The large window has a top 28. The large window is formed of a transparent material. The large window is movable to a raised orientation and a lowered orientation. In the raised orientation, the top of the large window is within the upper slot of the window opening. In the lowered orientation the top of the large window is adjacent to the lower slot of the window opening.

A small window 32 is provided. The small window has an upper edge 34. The small window has a lower edge 36. The small window also has a forward edge 38. The small window further has a rearward edge 40. The small window is formed of a transparent material. The small window is positionable in the window opening. The upper edge of the small window is closely spaced from the upper slot. The lower edge of the small window is closely spaced from the lower slot. The front edge of the small window is closely spaced from the front slot.

A support assembly 44 is provided. The support assembly includes a peripheral frame 46. The peripheral frame encompasses the upper and lower and forward and rearward edges of the small window. The support assembly includes a tubular upper cylinder 48. The upper cylinder is provided upwardly from the peripheral frame adjacent to the upper edge of the small window. The support assembly includes a lower cylinder 50. The lower cylinder extends downwardly from the peripheral frame adjacent to the lower edge of the small window. The upper and lower cylinders are vertical and co-axial.

A lower attachment member 54 is provided next. The lower attachment member has a lowermost extension 56. The lower attachment member is formed of the lower cylinder and the lowermost extension. The lowermost extension has a forked lower end 58. The forked lower end is positioned over the top of the large window. The forked lower end spans the top of the large window. In this manner the lower attachment member is coupled to the lower slot. The large window is in the lowered orientation during operation and use.

Further provided is an upper attachment member 60. The upper attachment member is formed of a plurality of tubular telescoping sections. The upper attachment member has a lower section 62. The upper attachment member also has an intermediate section 64. The upper attachment member further has an upper section 66. The upper section is positioned within the upper slot during operation and use. A coil spring 68 is provided. The coil spring is positioned within the intermediate section and the lower section and the tubular upper cylinder. In this manner the upper attachment member may be contracted and extended for coupling the upper attachment member to the upper slot. The large window is in the lowered orientation during operation and use.

Provided last is an adjustment assembly 72. The adjustment assembly is formed in the lower attachment member. The adjustment assembly has a cylindrical stub 74. The cylindrical stub depends from the lower cylinder. The adjustment assembly has a cylindrical recess 76. The cylindrical recess is provided in the lowermost extension. The cylindrical recess rotatably receives the cylindrical stub. The adjustment assembly has downwardly facing hemispherical projections 78. The downward facing hemispherical projections are in a circular array around the stub. The adjustment assembly also has upwardly facing hemispherical projections 80. The upward facing hemispherical projections are provided in a circular array around the cylindrical recess. The upwardly facing hemispherical projections and the downwardly facing hemispherical projections are provided in axially contact. In this manner rotational movement between the upward facing hemispherical projections and the downward facing hemispherical projections is abated. The upwardly facing hemispherical projections and the downwardly facing hemispherical projections are axially spaced. In this manner rotational movement between the upwardly facing hemispherical projections and the upwardly facing hemispherical projections is allowed. Also in this manner the small window may be rotated about a vertical axis. Further in this manner the angular orientation of the small window may be varied and the extent of ventilation may be varied as a function of the angular orientation of the small window.

A wide variety of alternate embodiments are contemplated by the present invention. The primary preferred embodiment is illustrated and described herein. By way of example, the two separate upper and lower cylindrical sections about which the small window rotates could readily be replaced by a single tubular member with ends extending above and below the small window. Further, the small window is illustrated as being planar. Such planar window could include a tubular 90 degree elbow-shaped wind diverter. The diverter would have an input end outside of the car and an output end inside the car. Such diverter would be as a substitute for, or in addition to, the flat window as illustrated and described herein.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A ventilation system (10) comprising, in combination:
a vehicle (14) having a window opening (16), the window opening including an upper slot (18) and a lower slot (20) and a forward slot (22);
a large window (26) having a top (28), the large window being formed of a transparent material, the large window being movable to a raised orientation with the top of the large window within the upper slot of the window opening, the large window being movable to a lowered orientation with the top of the large window adjacent to the lower slot of the window opening;
a small window (32) having an upper edge (34) and a lower edge (36) and a forward edge (38) and a rearward edge (40), the small window being formed of a transparent material, the small window being positionable in the window opening with the upper edge of the small window closely spaced from the upper slot and with the lower edge of the small window closely spaced from the lower slot and with the front edge of the small window closely spaced from the front slot;
a support assembly (44) including a peripheral frame (46) encompassing the upper and lower and forward and rearward edges of the small window, the support assembly including a tubular upper cylinder (48) extending upwardly from the peripheral frame adjacent to the upper edge of the small window, the support assembly including a lower cylinder (50) extending downwardly from the peripheral frame adjacent to the lower edge of the small window, the upper and lower cylinders being vertical and co-axial;

a lower attachment member (54) formed of the lower cylinder and a lowermost extension (56), the lowermost extension having a forked lower end (58) positioned over and spanning the top of the large window for coupling the lower attachment member to the lower slot while the large window is in the lowered orientation during operation and use;

an upper attachment member (60) formed of a plurality of tubular telescoping sections including a lower section (62), an intermediate section (64) and an upper section (66), the upper section being positioned within the upper slot during operation and use, a coil spring (68) positioned within the intermediate section and the lower section and the tubular upper cylinder whereby the upper attachment member may be contracted and extended for coupling the upper attachment member to the upper slot while the large window is in the lowered orientation during operation and use; and an adjustment assembly (72) formed in the lower attachment member, the adjustment assembly having a cylindrical stub (74) depending from the lower cylinder and a cylindrical recess (76) in the lowermost extension rotatably receiving the cylindrical stub, the adjustment assembly having downwardly facing hemispherical projections (78) in a circular array around the stub, the adjustment assembly also having upwardly facing hemispherical projections (80) in a circular array around the cylindrical recess, the upwardly facing hemispherical projections and the downwardly facing hemispherical projections being in axially contact to abate rotational movement there between, the upwardly facing hemispherical projections and the downwardly facing hemispherical projections being axially spaced to allow rotational movement there between whereby the small window may be rotated about a vertical axis to vary the angular orientation of the small window to vary the extent of ventilation as a function of the angular orientation of the small window.

\* \* \* \* \*